(12) United States Patent
Cho et al.

(10) Patent No.: US 12,193,178 B2
(45) Date of Patent: Jan. 7, 2025

(54) DISPLAY DEVICE AND MANUFACTURING METHOD THEREFOR

(71) Applicant: LG ELECTRONICS INC., Seoul (KR)

(72) Inventors: Myoungjin Cho, Seoul (KR); Seungwook Noh, Seoul (KR); Sungyeon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 109 days.

(21) Appl. No.: 18/011,044

(22) PCT Filed: Jun. 19, 2020

(86) PCT No.: PCT/KR2020/008020
§ 371 (c)(1),
(2) Date: Dec. 16, 2022

(87) PCT Pub. No.: WO2021/256591
PCT Pub. Date: Dec. 23, 2021

(65) Prior Publication Data
US 2023/0247784 A1 Aug. 3, 2023

(51) Int. Cl.
*H05K 5/02* (2006.01)
*H01L 21/66* (2006.01)
(Continued)

(52) U.S. Cl.
CPC ........... *H05K 5/0217* (2013.01); *H01L 22/20* (2013.01); *H01L 25/167* (2013.01); *H05K 5/0021* (2013.01)

(58) Field of Classification Search
CPC ... H05K 5/0217; H05K 5/0021; H05K 5/0008
See application file for complete search history.

(56) References Cited

U.S. PATENT DOCUMENTS 10,101,603 B2 * 10/2018 Cho ................ G02F 1/133308
2008/0218954 A1 * 9/2008 Kawano ................ H05K 5/02
361/679.02
(Continued)

FOREIGN PATENT DOCUMENTS

KR 10-2015-0014075 A 2/2015
KR 10-2016-0097599 A 8/2016
(Continued)

OTHER PUBLICATIONS

International Search Report for PCT/KR2020/008020 (PCT/ISA/210) mailed on Mar. 16, 2021.

*Primary Examiner* — Sherman Ng
(74) *Attorney, Agent, or Firm* — Birch, Stewart, Kolasch & Birch, LLP

(57) ABSTRACT

Discussed is a display that can include a display panel, a nut fixed to a rear surface of the display panel, a frame including a female thread formed in a fastening hole facing the nut, an outer adjusting member including a hollow portion formed therein having a male thread that is screwed with the female thread of the fastening hole, and an outer head portion protruding out of the hollow portion. An inner fixing member can be further included and can include a thread portion passing through the hollow portion and screwed with the nut, and an inner head portion seated on the outer head portion or the hollow portion.

19 Claims, 13 Drawing Sheets

(51) Int. Cl.
  *H01L 25/16* (2023.01)
  *H05K 5/00* (2006.01)

(56) References Cited

U.S. PATENT DOCUMENTS

2012/0099044 A1* 4/2012 Lin .................... G02F 1/13452
                                                  349/58
2015/0177449 A1* 6/2015 Uchida ............. G02F 1/133308
                                                  362/611

FOREIGN PATENT DOCUMENTS

| KR | 10-2017-0000575 A | 1/2017 |
| KR | 10-2017-0015773 A | 2/2017 |
| KR | 10-1898706 B1 | 9/2018 |
| KR | 10-2019-0068123 A | 6/2019 |

* cited by examiner

【FIG. 1】
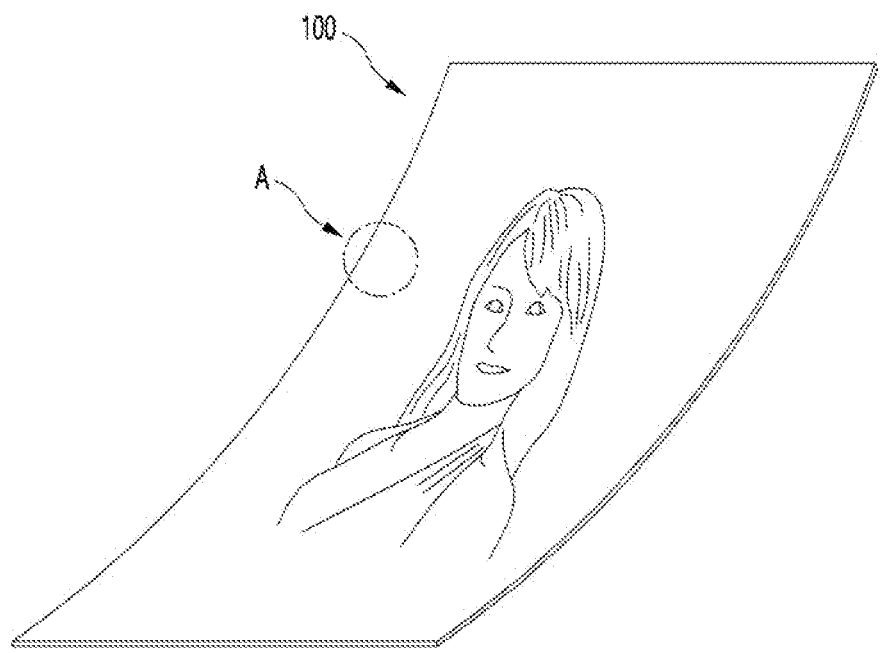
【FIG. 2】
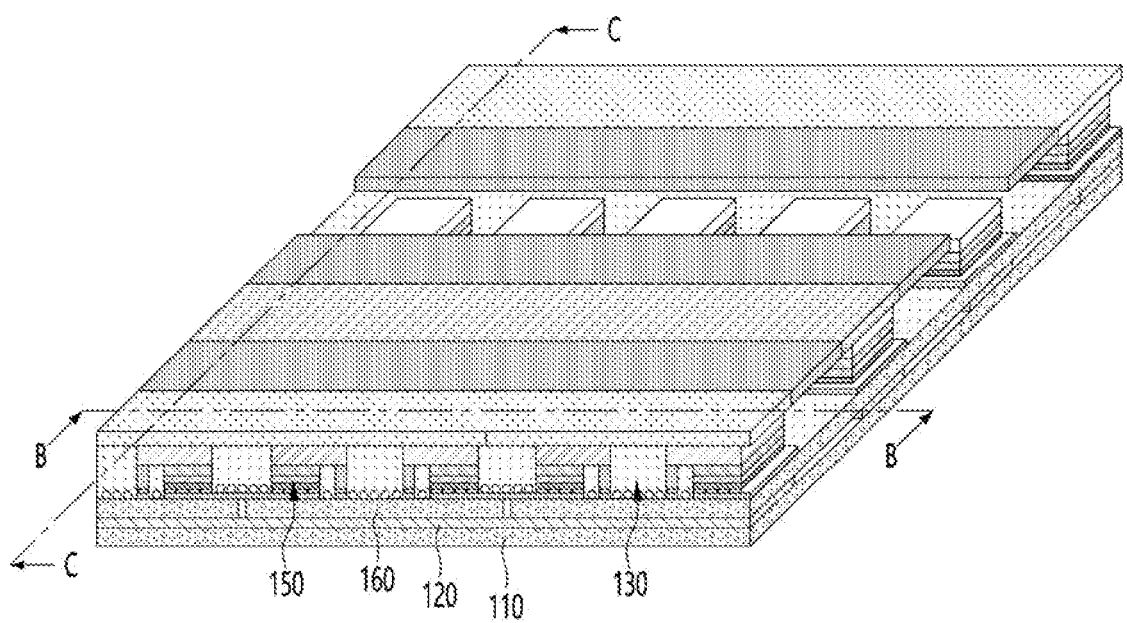

【FIG. 3a】
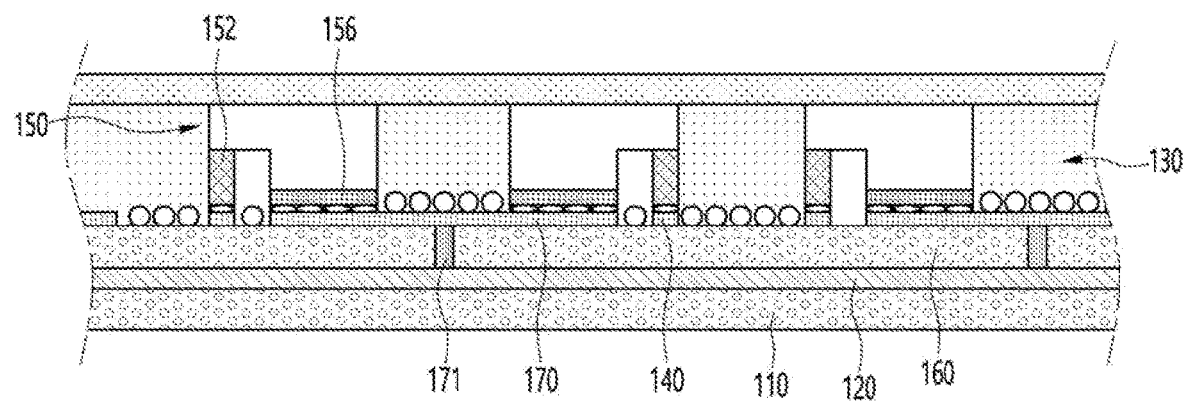
【FIG. 3b】
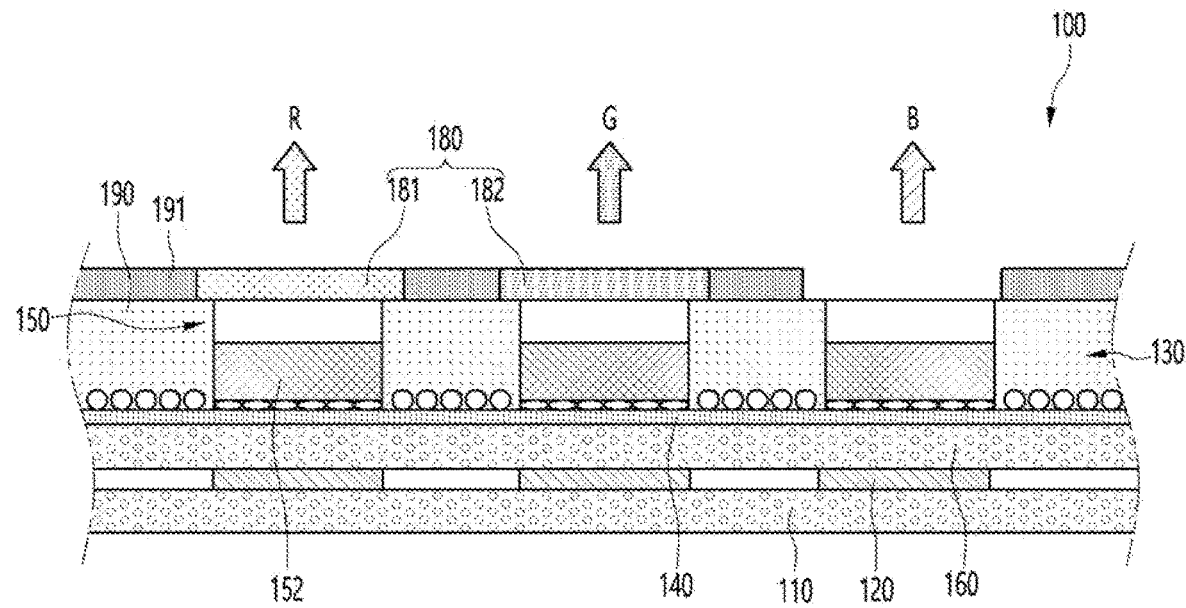

[FIG. 4]
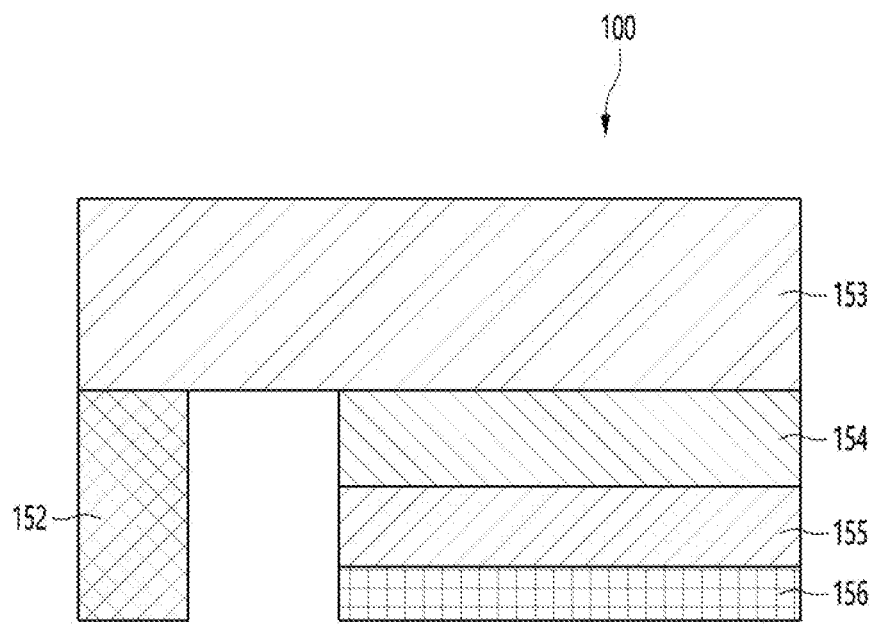
[FIG. 5a]
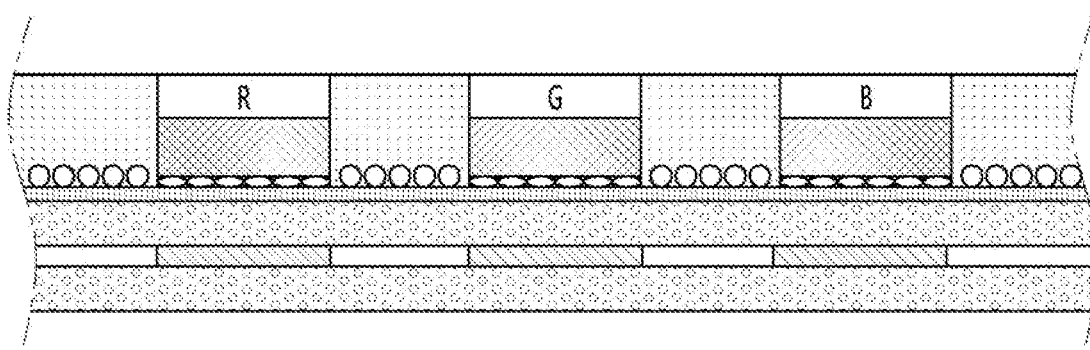

【FIG. 5b】
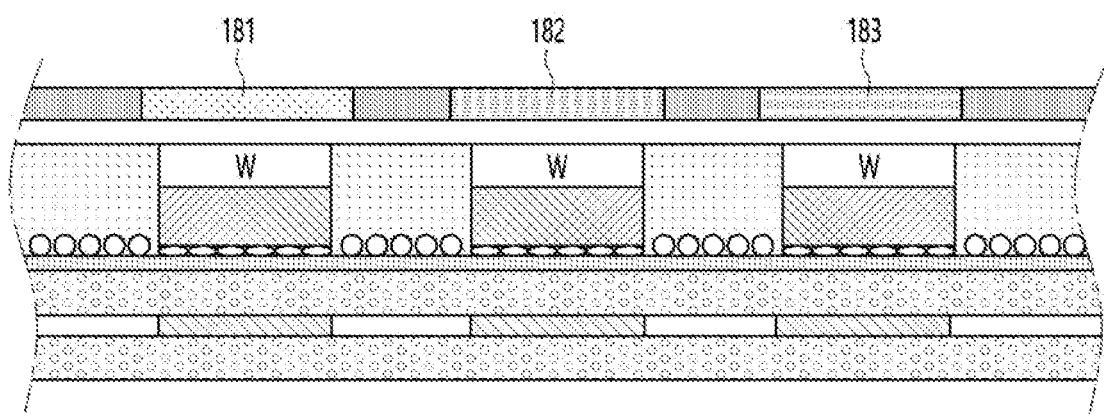
【FIG. 5c】
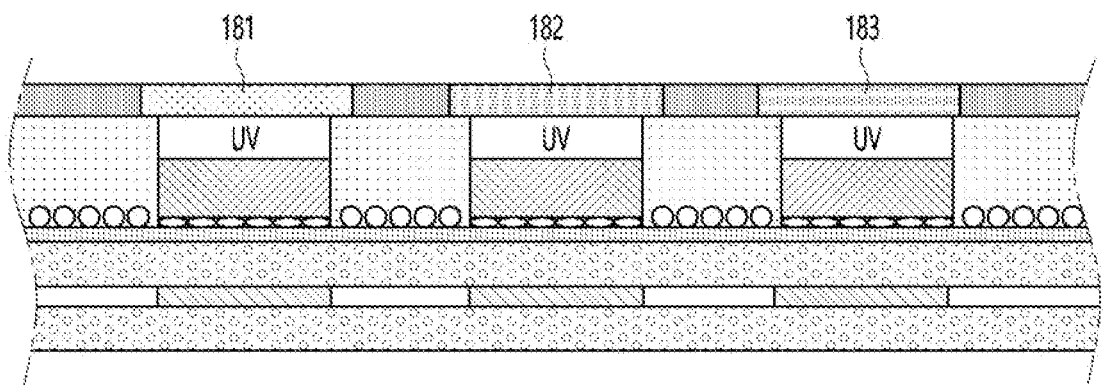

【FIG. 6】
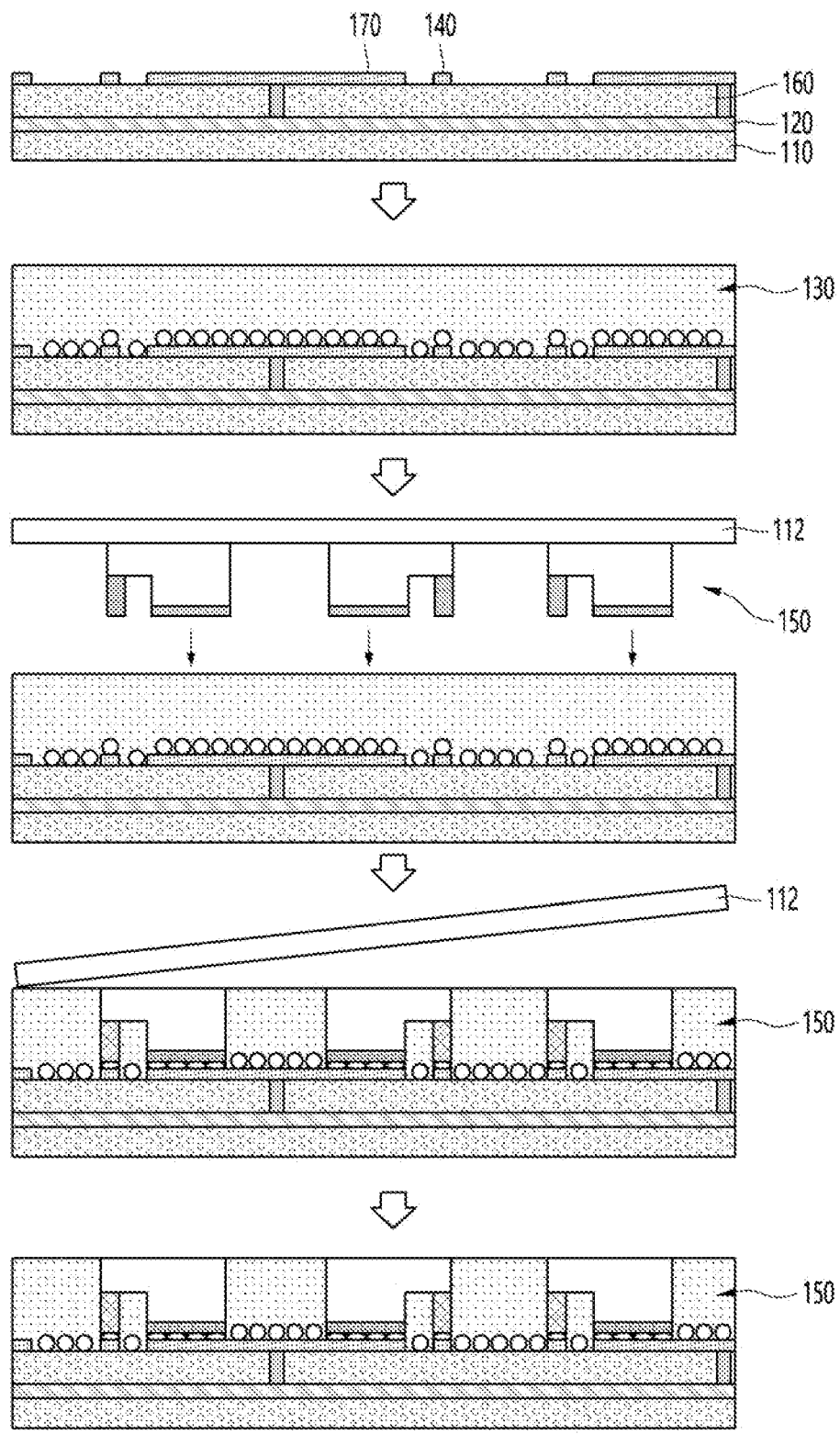

[FIG. 7]
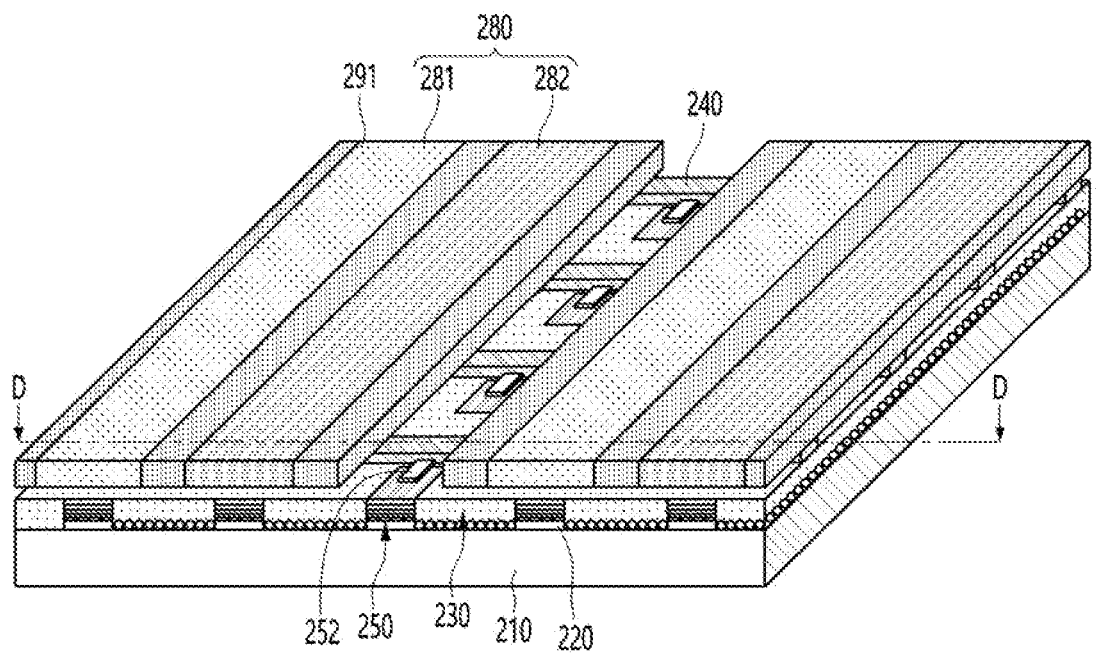
[FIG. 8]
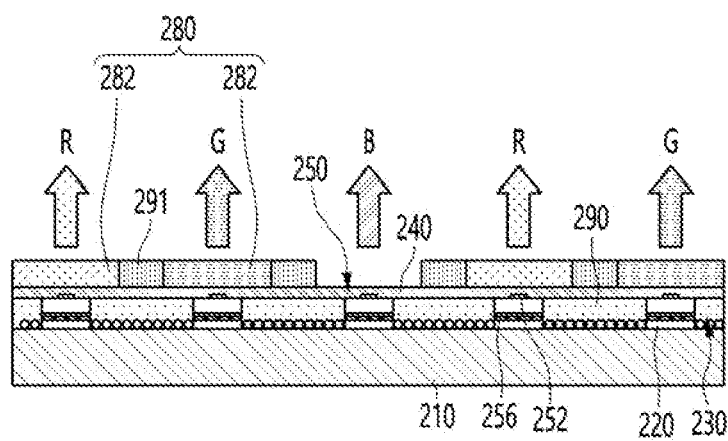

[FIG. 9]
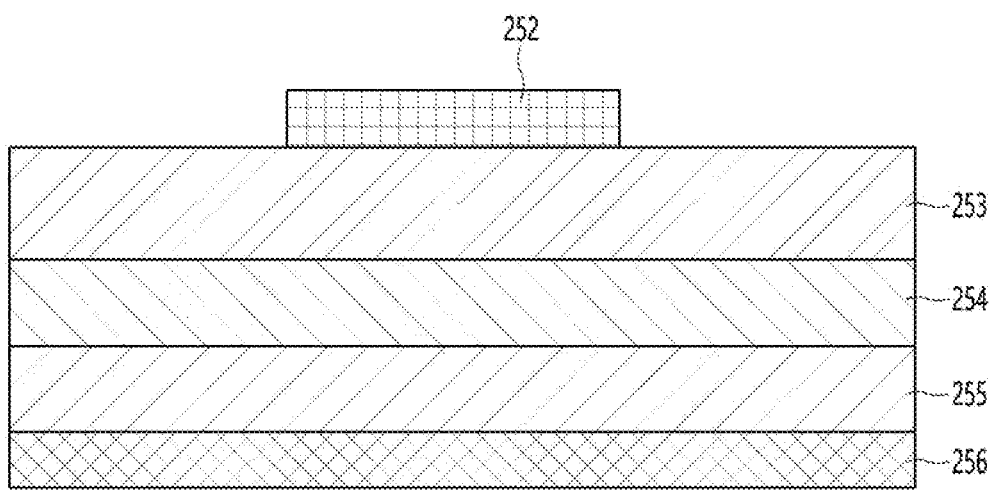

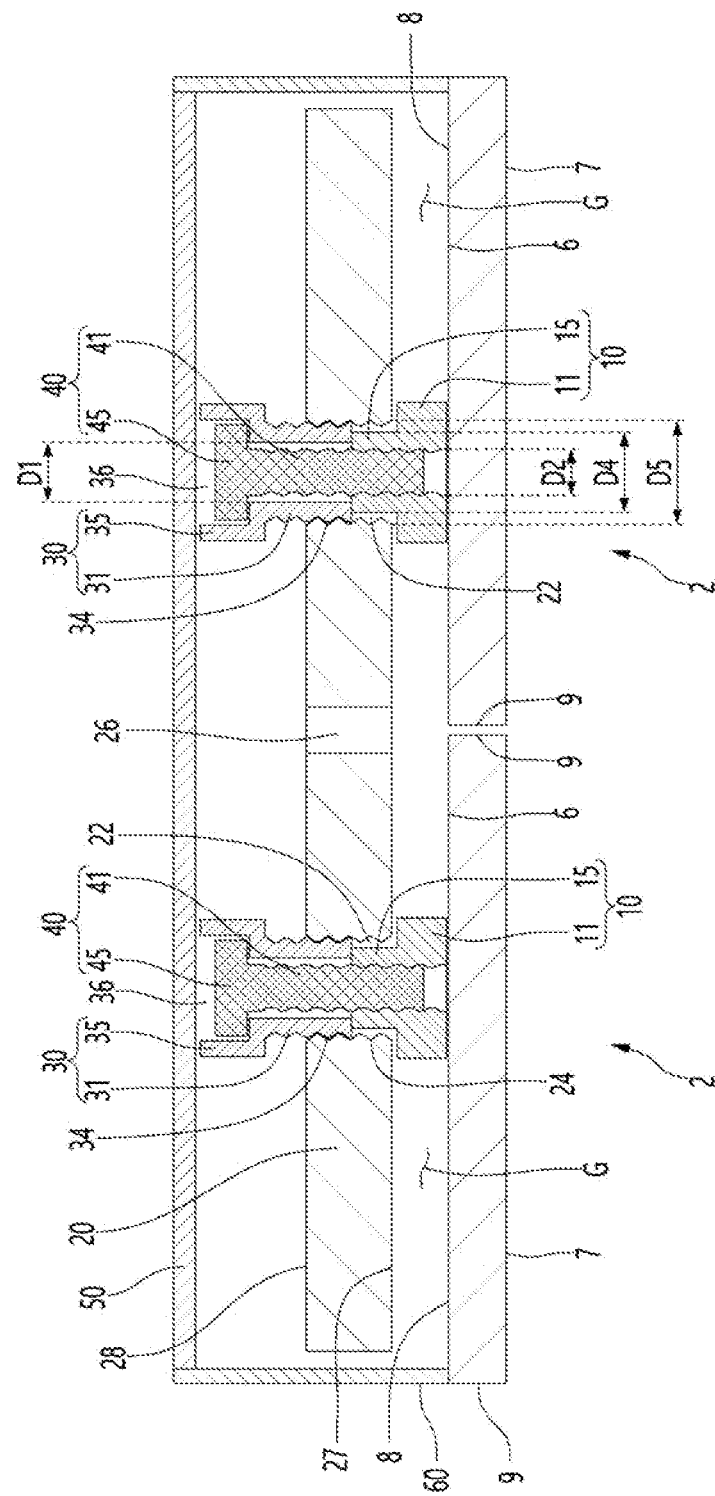
[FIG. 10]

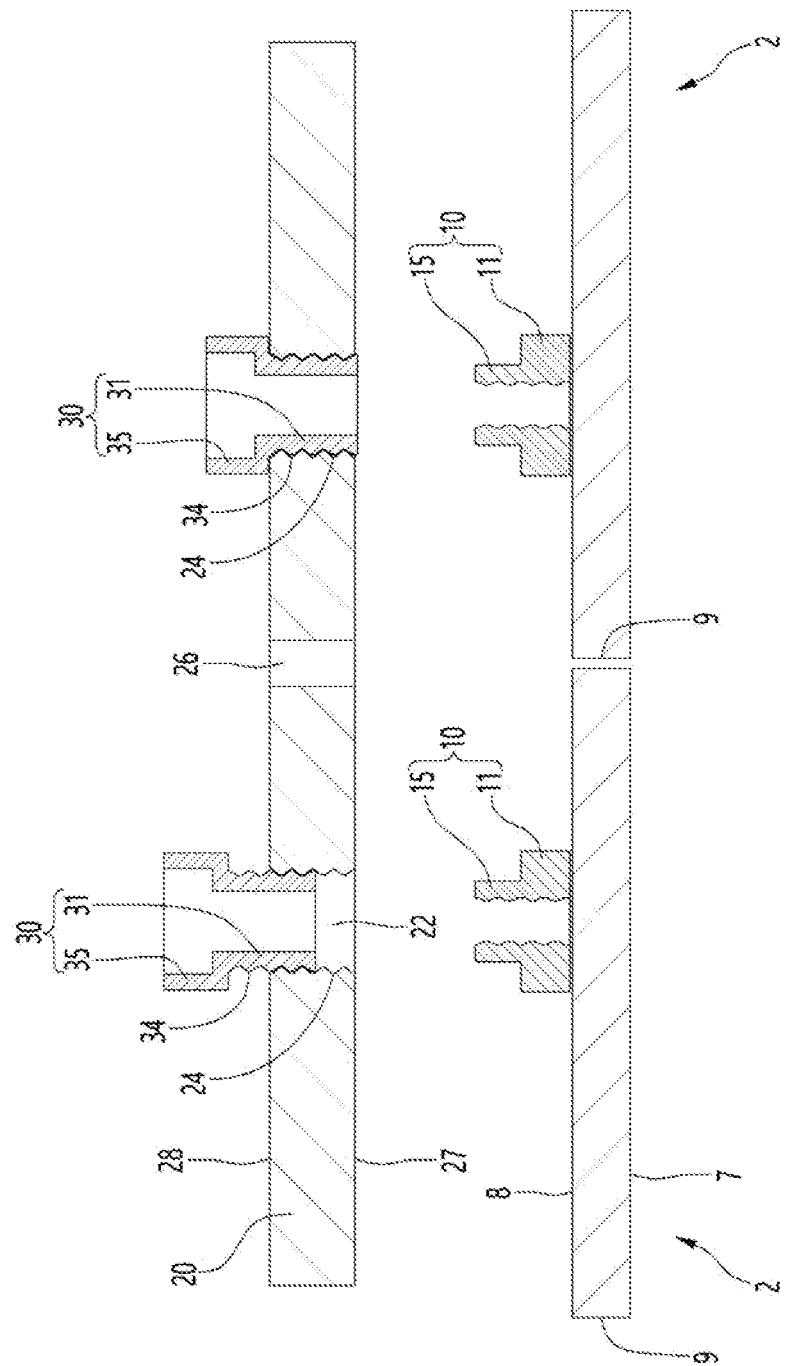
[FIG. 11]

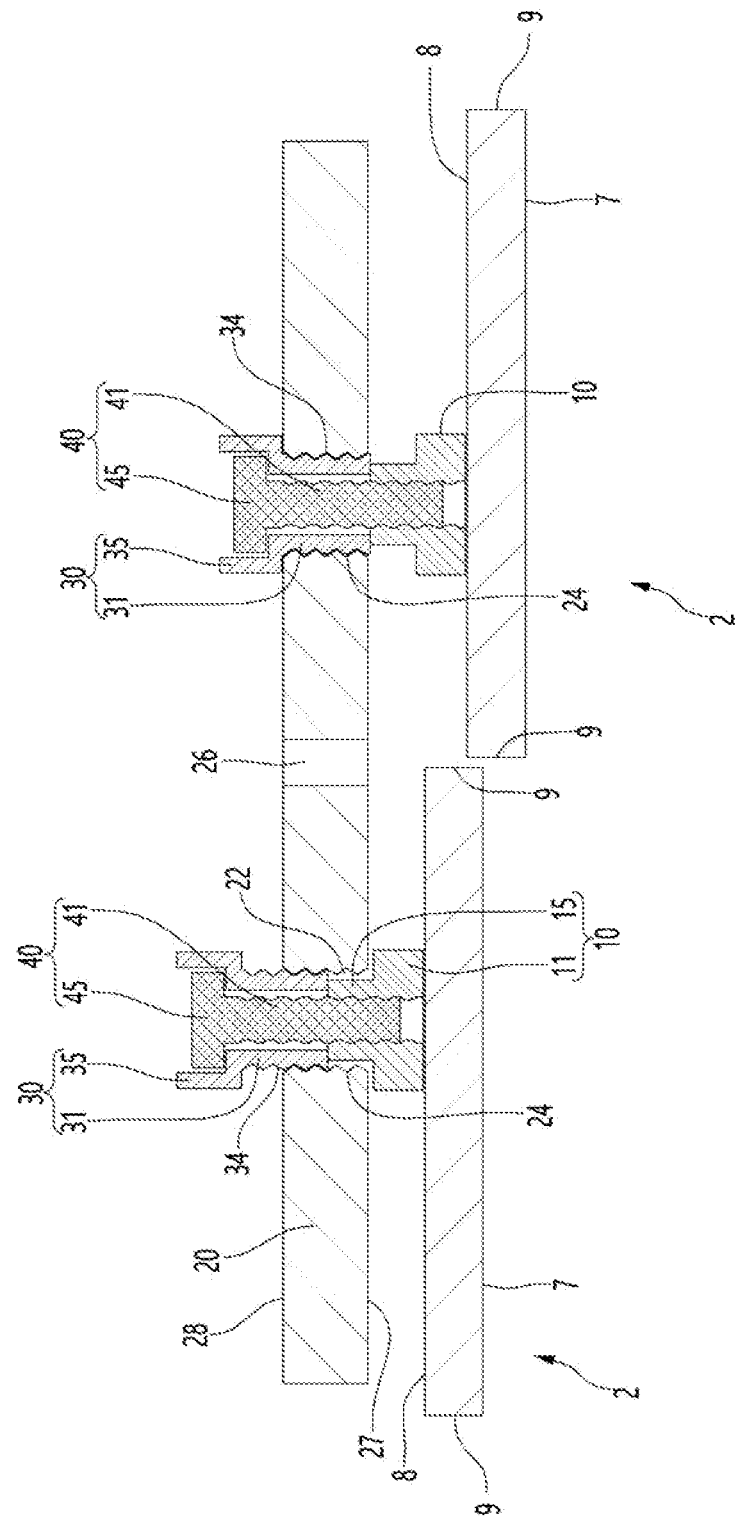
[FIG. 12]

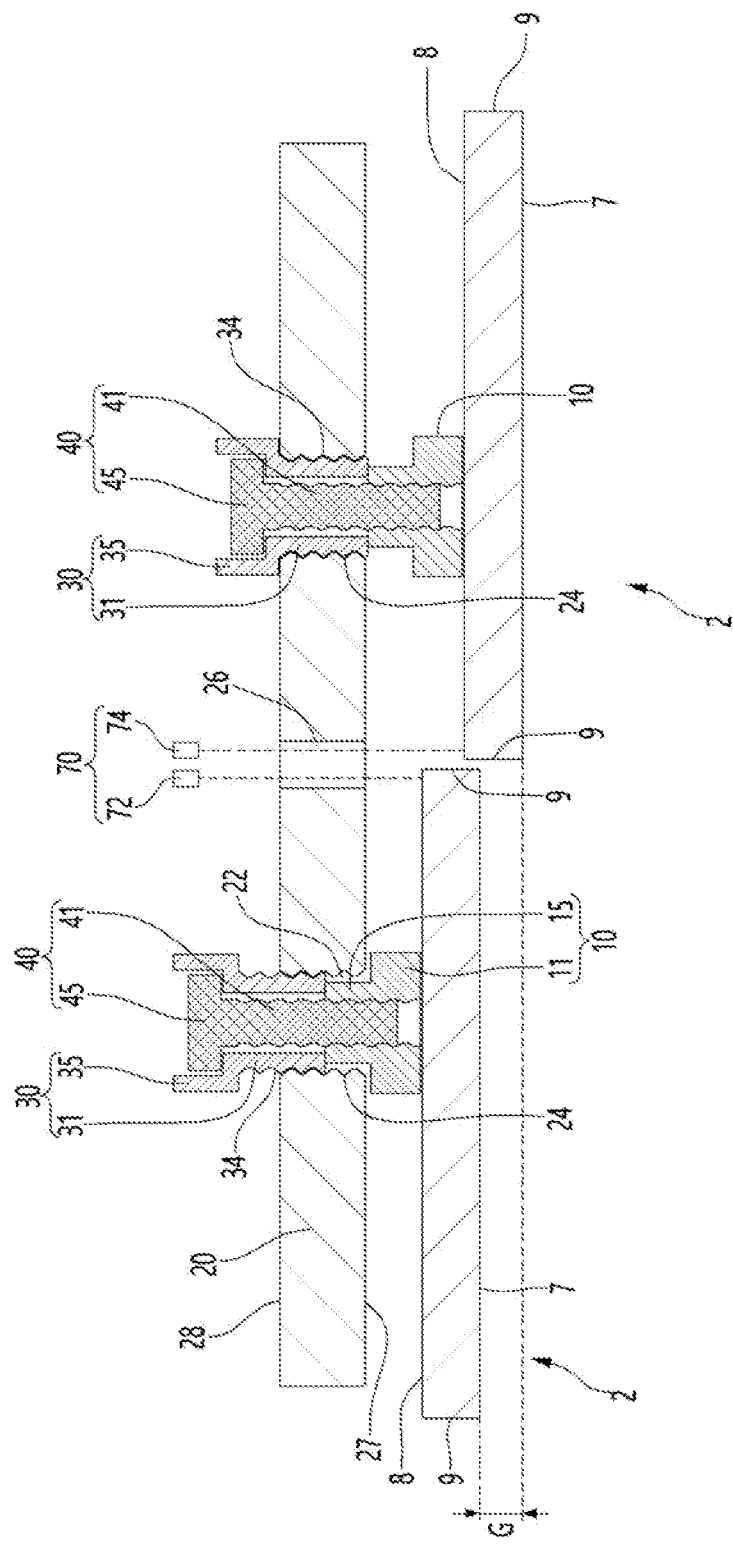
[FIG. 13]

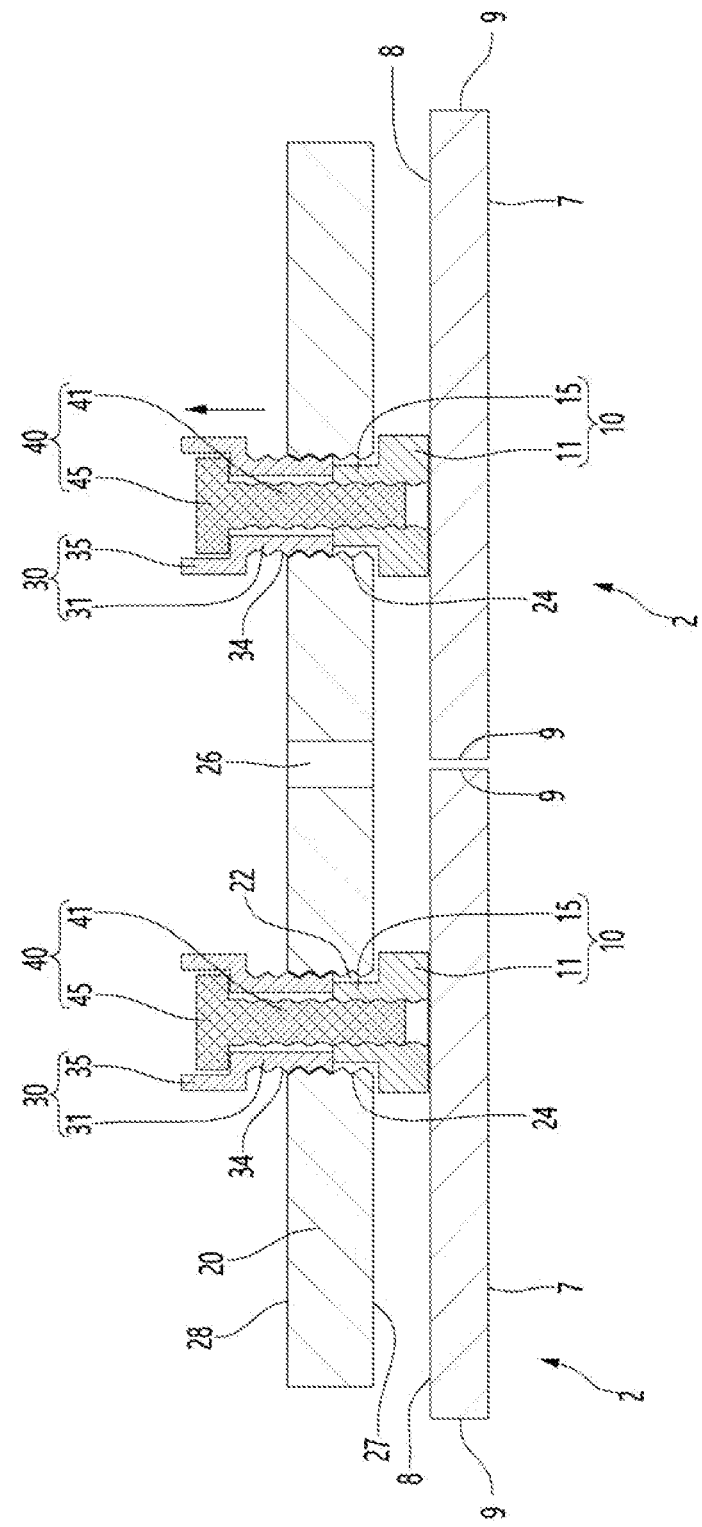
[FIG. 14]

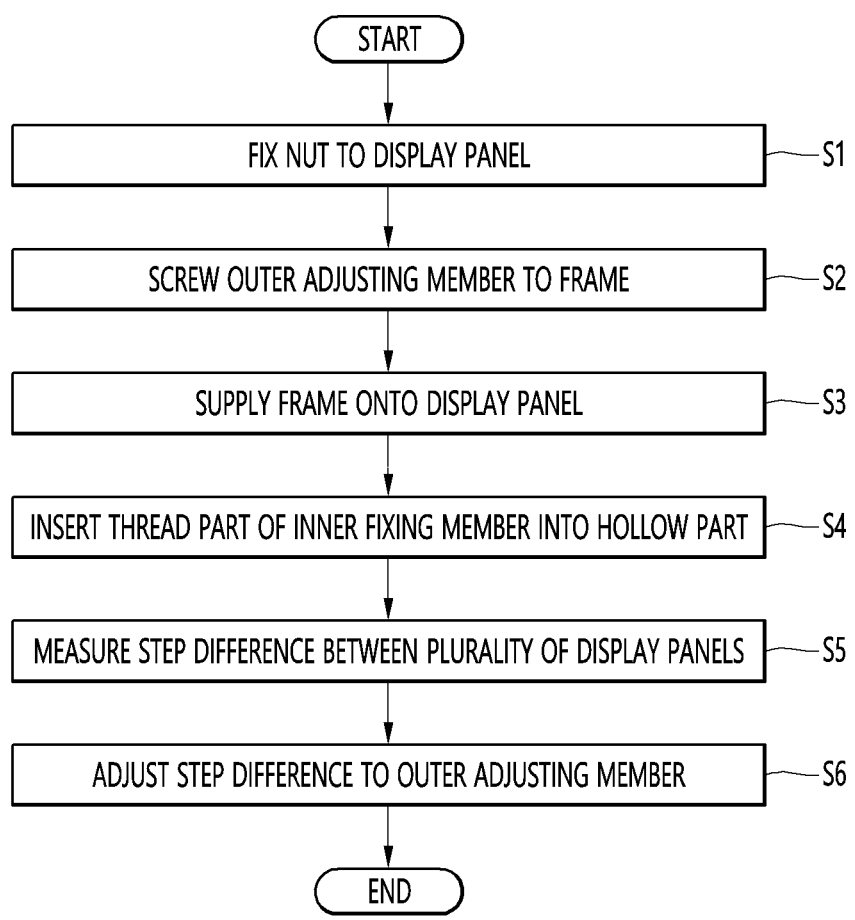

DISPLAY DEVICE AND MANUFACTURING METHOD THEREFOR

CROSS REFERENCE TO RELATED APPLICATIONS

This application is the National Stage filing under 35 U.S.C. 371 of International Application No. PCT/KR2020/008020, filed on Jun. 19, 2020, the entire contents of which are hereby expressly incorporated by reference into the present application.

TECHNICAL FIELD

The present disclosure relates to a display and a method for manufacturing the same.

BACKGROUND ART

Recently, displays having excellent characteristics such as a thin shape and flexibility have been developed in the display technology field. On the other hand, an LCD (Liquid Crystal Display) and AMOLED (Active Matrix Organic Light Emitting Diodes) are representative of main displays that are commonly used now.

However, the LCD has a problem that a response time is not short and it is difficult to implement flexibility and AMOLED has a defect that the lifespan is short and the yield is not good.

Meanwhile, a light emitting diode (LED), which is a well-known semiconductor device that converts a current into light, has been used as a light source for displaying images in electronic devices including information devices together with a green LED based on GaP: N since a red LED using a GaAsP compound semiconductor was commercialized in 1962. Accordingly, a plan that solves the problems by implementing a display using the semiconductor LED may be proposed. Such an LED has the advantage of a long lifespan, low power consumption, an excellent initial driving characteristic, high vibration resistance, etc., as compared with a filament-based light emitting element.

DISCLOSURE

Technical Problem

The present disclosure provides a display, which can be easily assembled and can minimize the step difference between a plurality of display panels, and a method for manufacturing the same.

Technical Solution

According to an embodiment of the present disclosure, a display may include a display panel; a nut fixed to a rear surface of the display panel; a frame including a female thread formed in a fastening hole facing the nut; an outer adjusting member including a hollow portion formed therein with a male thread screwed with the female thread, and an outer head portion protruding out of the hollow portion; and an inner fixing member including a thread portion passing through the hollow portion and screwed with the nut, and an inner head portion seated on the outer head portion or the hollow portion. A plurality of display panels, a plurality of nuts, a plurality of outer adjusting members, and a plurality of inner fixing members may be provided.

The rear surface of the display panel may be spaced apart from a front surface of the frame.

The outer head portion is formed therein with a space to receive the inner head portion.

An outer circumference of the outer head portion may have a polygonal shape.

A rear end of the nut may be a contact end to make contact with a front end of the outer adjusting member.

The nut may include a first body larger than the fastening hole, and a second body protruding from the first body and smaller than the fastening hole An inner diameter of the hollow portion may be larger than an inner diameter of the second body and an outer diameter of the thread portion An outer diameter of the second body may be smaller than an outer diameter of the hollow portion and greater than an inner diameter of the hollow.

The frame may be formed therein with an opening spaced apart from the fastening hole and facing an edge of the display panel.

The opening may be open toward edges of a pair of display panels adjacent to each other.

According to an embodiment of the present disclosure, a method for manufacturing a display, may include seating a plurality of display panels having nuts fixed thereto on a stage, such that the nuts face up, screwing a hollow portion of an outer adjusting member with a frame including a fastening hole having a female thread; positioning the frame screwed with the outer adjusting member above the plurality of display panels to be spaced apart from the plurality of display panels; inserting a thread portion of an inner fixing member into the hollow portion and screwing the thread portion with the nut; sensing a step difference between the plurality of display panels; and aligning the plurality of display panels in line with each other by rotating the outer adjusting member, when the step difference between the plurality of display panels is out of a set range.

The aligning of the plurality of display panels in line with each other may include assembling the display panel to be spaced apart from the frame.

An inner head portion of the inner fixing member may be inserted into and received in an outer head portion protruding out of the hollow portion.

The inserting of the thread portion of the inner fixing member with the nut may include bringing the nut in contact with the hollow portion.

The sensing of the step difference between the plurality of display panels may include sensing, by a distance sensor disposed above the opening formed in the frame, a distance between edges of a pair of display panels adjacent to each other through an opening.

Advantageous Effects

According to an embodiment of the present disclosure, the process number can be minimized to minimize the step difference between the plurality of display panels.

In addition, the step difference between the plurality of display panels may be minimized by adjusting the assembling height of the outer adjusting member.

In addition, the step difference between the pair of display panels may be sensed through the opening formed in the frame.

DESCRIPTION OF DRAWINGS

FIG. 1 is a conceptual view showing an embodiment of a display using a semiconductor light emitting diode of the present disclosure.

FIG. 2 is a partial enlarged view of the part A of FIG. 1 and FIGS. 3A and 3B are cross-sectional views taken along line B-B and C-C of FIG. 2.

FIG. 4 is a conceptual view showing a flip-chip type semiconductor light emitting diode of FIG. 3.

FIGS. 5A to 5C are conceptual views showing various types that implement colors in relation to a flip-chip type semiconductor light emitting diode.

FIG. 6 shows cross-sectional views illustrating a method of manufacturing a display using a semiconductor light emitting diode of the present disclosure.

FIG. 7 is a perspective view showing another embodiment of a display using a semiconductor light emitting diode of the present disclosure.

FIG. 8 is a cross-sectional view taken along line D-D of FIG. 7.

FIG. 9 is a conceptual view showing a vertical semiconductor light emitting diode of FIG. 8.

FIG. 10 is a cross-sectional view illustrating a frame, an inner fixing member, and an outer adjusting member according to an embodiment of the present disclosure.

FIG. 11 is a cross-sectional view illustrating a frame positioned on a plurality of display panels according to an embodiment of the present disclosure.

FIG. 12 is a cross-sectional view an inner fixing member screwed with the nut illustrated in FIG. 11.

FIG. 13 is a cross-sectional view illustrating a step difference between a plurality of display panels illustrated in FIG. 12, when the step difference is measured.

FIG. 14 is a cross-sectional view illustrating a plurality of display panels illustrated in FIG. 13 aligned in line.

FIG. 15 is a flowchart illustrating a method for manufacturing a display according to the present embodiment.

BEST MODE

Mode for Invention

Hereafter, embodiments of the present disclosure will be described in detail with reference to the accompanying drawings and the same or similar components are given the same reference numerals regardless of the numbers of figures and are not repeatedly described. Terms "module" and "unit" that are used for components in the following description are used only for the convenience of description without having discriminate meanings or functions. In the following description, if it is decided that the detailed description of known technologies related to the present disclosure makes the subject matter of the embodiments described herein unclear, the detailed description is omitted. Further, it should be noted that the accompanying drawings are provided only for easy understanding of the embodiments disclosed herein and the spirit of the present disclosure should not be construed as being limited to the accompanying drawings.

When an element such as a layer, a region, or a substrate is referred to as being "on," another element, it may be directly on the other element, or an intervening element may be present therebetween.

A display described herein may include a mobile phone, a smart phone, a laptop computer, a digital broadcasting terminal, a PDA (personal digital assistants), a PMP (portable multimedia player), a navigation, a slate PC, a tablet PC, a ultra book, a digital TV, a desktop computer, etc. However, it would be easily understood by those skilled in the art that the configuration according to embodiments described here may be applied to devices that can be equipped with a display, even if the devices are new types of products that will be developed in future.

FIG. 1 is a conceptual diagram showing an embodiment of a display using a semiconductor light emitting diode of the present disclosure.

Referring to the figure, information that is processed by a controller of a display 100 can be displayed using a flexible display.

The flexible display includes displays that can be bent, curved, twisted, folded, and rolled by external force. For example, the flexible display may be a display that is manufactured on a thin and flexible substrate, which can be bent, curved, folded, or rolled like paper, while maintaining the display characteristics of existing flat panel display.

In a state in which the flexible display is not bent (e.g., in which the flexible display has an infinite radius of curvature, which is referred to as a 'first state' hereafter), the display region of the flexible display becomes a flat surface. In a state in which the flexible display is bent from the first state by external force (e.g., in which the flexible display has a finite radius of curvature, which is referred to as a 'second state' hereafter), the display region may be a curved surface. As shown in the figure, the information that is displayed in the second state may be visual information that is output on the curved surface. Such visual information is implemented by individual control of light emission of sub-pixels disposed in a matrix type. The sub-pixel means a minimum unit for implementing one color.

The sub-pixels of the flexible display can be implemented by a semiconductor light emitting diode. A light emitting diode (LED) that is a kind of semiconductor light emitting diode converting a current into light is exemplified in the present disclosure. The light emitting diode is formed in a small size, so it can function as a sub-pixel even in the second state.

Hereafter, a flexible display implemented using the light emitting diode is described in more detail with reference to drawings.

FIG. 2 is a partial enlarged view of the portion A of FIG. 1, FIGS. 3A and 3B are cross-sectional views taken along lines B-B and C-C of FIG. 2, FIG. 4 is a conceptual view showing a flip-chip type semiconductor light emitting diode of FIG. 3A, and FIGS. 5A to 5C are conceptual views showing various types that implement colors in relation to a flip-chip type semiconductor light emitting diode.

According to FIGS. 2, 3A, and 3B, as a display 100 using a semiconductor light emitting diode, a display 100 using a passive matrix (PM) type of semiconductor light emitting diode is exemplified. However, examples to be described hereafter can be applied also to an active matrix (AM) type of semiconductor light emitting diode.

The display 100 includes a first substrate 110, a first electrode 120, a conductive adhesive layer 130, a second electrode 140, and a plurality of semiconductor light emitting diodes 150.

The substrate 110 may be a flexible substrate. For example, the substrate 110 may include glass or polyimide (PI) to implement a flexible display. Further, any materials may be used as long as they have insulation and flexibility such as PEN (Polyethylene Naphthalate) and PET (Polyethylene Terephthalate). Further, the substrate 110 may be made of any one of a transparent material or an opaque material.

The substrate 110 may be a wiring board on which the first electrode 120 is disposed, so the first electrode 120 may be positioned on the substrate 110

According to the drawings, an insulating layer 160 may be disposed over the substrate 110 on which the first electrode 120 is positioned, and an auxiliary electrode 170 may be positioned on the insulating layer 160. In this case, the state in which the insulating layer 160 is stacked on the substrate 110 may be one wiring board. In more detail, the insulating layer 160 may be made of an insulating and flexible material, such as PI (Polyimide), PET, and PEN, integrally with the substrate 110, thereby forming one substrate.

The auxiliary electrode 170, which is an electrode electrically connecting the semiconductor light emitting diodes 150, is positioned on the insulating layer 160 and disposed to correspond to the first electrode 120. For example, the auxiliary electrode 170 has a dot shape and can be electrically connected with the first electrode 120 by electrode holes 171 formed through the insulating layer 160. The electrode hole 171 may be formed by filing a via hole with a conductive material.

Referring to the figures, the conductive adhesive layer 130 is formed on a surface of the insulating layer 160, but the present disclosure is not necessarily limited thereto. For example, a structure, in which a layer performing a specific function is formed between the insulating layer 160 and the conductive adhesive layer 130 or the conductive adhesive layer 130 is disposed on the substrate 110 without the insulating layer 160, is possible. In the structure in which the conductive adhesive layer 130 is disposed on the substrate 110, the conductive adhesive layer 130 can function as an insulating layer.

The conductive adhesive layer 130 may be a layer having an adhesive property and conductivity, and to this end, a substance having conductivity and a substance having an adhesive property may be mixed in the conductive adhesive layer 130. Further, the conductive adhesive layer 130 has ductility, so it enables the flexible function of the display.

As an example of this case, the conductive adhesive layer 130 may be an anisotropy conductive film (ACF), an anisotropy conductive paste, and a solution containing conductive particles. The conductive adhesive layer 130 may be configured as a layer that allows for electrical connection in a Z direction passing through the thickness, but has electrical insulation in the horizontal X-Y direction. Accordingly, the conductive adhesive layer 130 may be referred to as a Z-axial conductive layer (however, hereafter, referred to as a 'conductive adhesive layer').

The anisotropic conductive film is a film in which an anisotropic conductive medium is mixed in an insulating base member, and only a specific portion is given conductivity by the anisotropic conductive medium when heat and pressure are applied. It is assumed in the following description that heat and pressure are applied to the anisotropic conductive film, but other methods are also possible so that the anisotropic conductive film partially has conductivity. These methods, for example, may be a case of applying only any one of heat and pressure or a case of UV curing.

Further, the anisotropic conductive medium, for example, may be a conductive ball or a conductive particle. According to the figures, in this embodiment, the anisotropic conductive film is a film in which conductive balls are mixed in an insulating base member, and only a specific portion is given conductivity by the conductive balls when heat and pressure are applied. The anisotropic conductive film may be in a state in which a plurality of particles coated with an insulating film made of a polymer material is contained in a core made of a conductive substance, and in this case, when heat and pressure are applied a portion, the insulating film is broken at the portion and the portion is given conductivity by the core. In this case, the shape of the core is deformed, so layers that are in contact with each other in the thickness direction of the film may be formed. As a more detailed example, heat and pressure are applied throughout the anisotropic conductive film and Z-axial electrical connection is partially formed by the height difference of an object that is bonded by the anisotropic conductive film.

As another example, the anisotropic conductive film may be in a state in which a plurality of particles coated with a conductive substance is contained in an insulating core. In this case, when heat and pressure are applied to a portion, the conductive substance at the portion is deformed (gets scored and sticks), so the portion is given conductivity in the thickness direction of the film. As another example, the conductive substance may pass through the insulating base member in the Z-axial direction to show conductivity in the thickness direction of the film. In this case, the conductive substance may have a pointed end.

According to the figures, the anisotropic conductive film may be a fixed array ACF in which conductive balls are inserted in a surface of an insulating base member. In more detail, the insulating base member is made of an adhesive substance, the conductive balls are concentrated at the bottom of the insulating base member, and when heat and pressure are applied to the base member, the base member is deformed with the conductive balls, thereby being given vertical conductivity.

However, the present disclosure is not limited thereto, and the anisotropic conductive film may be configured in a type in which conductive balls are randomly mixed in an insulating base member or a type in which a plurality of layers is provided and conductive balls are disposed in any one layer (double-ACF).

The anisotropic conductive paste is formed by combining a paste and conductive balls, and may be a paste in which conductive balls are mixed in an insulating and adhesive base substance. Further, the solution containing conductive particles may be a solution containing conductive particles or nano particles.

Referring to figures again, the second electrode 140 is spaced apart from the auxiliary electrode 170 and positioned on the insulating layer 160. That is, the conductive adhesive layer 130 is disposed on the insulating layer 160 on which the auxiliary electrode 170 and the second electrode 140 are positioned.

When the conductive adhesive layer 130 is formed in a state in which the auxiliary electrode 170 and the second electrode 140 are positioned on the insulating layer 160, and then the semiconductor light emitting diode 150 is connected in a flip-chip type by applying heat and pressure, the semiconductor light emitting diode 150 is electrically connected with the first electrode 120 and the second electrode 140.

Referring to FIG. 4, the semiconductor light emitting diode may be a flip-chip type light emitting diode.

For example, the semiconductor light emitting diode includes a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 horizontally spaced apart from the p-type electrode 156 on the n-type semiconductor layer 153. In this case, the p-type electrode 156 can be electrically connected with the auxiliary electrode 170 by the conductive adhesive layer 130, and the n-type electrode 152 can be electrically connected with the second electrode 140.

Referring to FIGS. 2, 3A, and 3B again, the auxiliary electrode 170 is elongated in one direction and at least one auxiliary electrode can be electrically connected with a plurality of semiconductor light emitting diodes 150. For example, the p-type electrodes of semiconductor light emitting diodes at left and right sides from an auxiliary electrode can be electrically connected with one auxiliary electrode.

In more detail, the semiconductor light emitting diode 150 is pressed into the conductive adhesive layer 130 by heat and pressure, so only the portion between the p-type electrode 156 of the semiconductor light emitting diode 150 and the auxiliary electrode 170 and the portion between the n-type electrode 152 of the semiconductor light emitting diode 150 and the second electrode 140 have conductivity, and the other portions do not have conductivity because the semiconductor light emitting diode is pressed inside. As described above, the conductive adhesive layer 130 not only couples, but also electrically connects the portion between the semiconductor light emitting diode 150 and the auxiliary electrode 170 and the portion between the semiconductor light emitting diode 150 and the second electrode 140.

Further, the plurality of semiconductor light emitting diodes 150 constitutes a light emitting diode array, and a fluorescent layer 180 is formed on the light emitting diode array.

The light emitting diode array may include a plurality of semiconductor light emitting diodes having different own luminance values. Each of the semiconductor light emitting diode 150 constitutes a sub-pixel and is electrically connected to the first electrode 120. For example, the first electrode 120 may be a plurality of pieces, the semiconductor light emitting diodes, for example, may be arranged in several lines, and the semiconductor light emitting diodes in each line may be electrically connected to any one of the plurality of first electrodes.

Further, since the semiconductor light emitting diodes are connected in a flip-chip type, it is possible to use grown semiconductor light emitting diodes for a transparent dielectric substrate. Further, the semiconductor light emitting diodes, for example, may be nitride semiconductor light emitting diodes. Since the semiconductor light emitting diode 150 has excellent luminance, it can constitute an individual sub-pixel even in a small size.

According to the figures, a separation wall 190 may be formed between the semiconductor light emitting diodes 150. In this case, the separation wall 190 can serve to separate individual sub-pixels and may be formed integrally with the conductive adhesive layer 130. For example, the semiconductor light emitting diodes 150 are inserted in the anisotropic conductive film, the base member of the anisotropic conductive film can form the separation wall.

Further, when the base member of the anisotropic conductive film is black, the separation wall 190 can have a reflective characteristic and the contrast can be increased even without a discrete black insulator.

As another example, a reflective separation wall may be provided as the separation wall 190. In this case, the separation wall 190 may include a black or white insulator, depending on the object of the display. When a separation wall of a white insulator is used, there can be an effect of increasing reflectivity, and when a separation wall of a black insulator, it is possible to have a reflective characteristic and increase contrast.

The fluorescent layer 180 may be positioned on the outer side of the semiconductor light emitting diode 150. For example, the semiconductor light emitting diode 150 is a blue semiconductor light emitting diode that emits blue light (B), and the fluorescent layer 180 performs a function of converting the blue light (B) into a color of a sub-pixel. The fluorescent layer 180 may be a red fluorescent body 181 or a green fluorescent body 182 that constitutes an individual pixel.

That is, the red fluorescent body 181 that can convert blue light into red light (R) may be stacked on a blue semiconductor light emitting diode at a position where a red sub-pixel is formed, and the green fluorescent body 182 that can convert blue light into green light (G) may be stacked on a blue semiconductor light emitting diode at a position where a green sub-pixel is formed. Further, only a blue semiconductor light emitting diode may be independently used a portion forming a blue sub-pixel. In this case, red (R), green (G), and blue (B) sub-pixels can form one pixel. In more detail, a fluorescent body having one color may be stacked along each line of the first electrode 120. Accordingly, in the first electrode 120, one line may be an electrode that controls one color. That is, red (R), green (G), and blue (B) may be sequentially disposed along the second electrode 140, whereby a sub-pixel can be implemented.

However, the present disclosure is not necessarily limited thereto, and red (R), green (G), and blue (B) sub-pixels may be implemented by combining the semiconductor light emitting diode 150 and a quantum dot (QD) instead of a fluorescent body.

Further, a black matrix 191 may be disposed between each of fluorescent bodies to improve contrast. That is, the black matrix 191 can improve the contrast of light and darkness.

However, the present disclosure is not necessarily limited thereto and another structure may be applied to implement blue, red, and green.

Referring to FIG. 5A, the semiconductor light emitting diodes 150 each may be implemented as a high-power light emitting diodes in which gallium nitride (GaN) is included as a main component and indium (In) and/or aluminum (Al) is added to emit various colors of light including blue.

In this case, the semiconductor light emitting diodes 150 may be red, green, and blue semiconductor light emitting diodes to from sub-pixels respectively. For example, red, green, and blue semiconductor light emitting diodes (R, G, and B) are alternately disposed, and sub-pixels of red, green, and blue constitute one pixel by the red, green, and blue semiconductor light emitting diodes, whereby a full-color display can be implemented.

Referring to FIG. 5B, the semiconductor light emitting diode may have white light emitting diodes (W) each having a yellow fluorescent layer. In this case, in order to form a sub-pixel, a red fluorescent layer 181, a green fluorescent layer 182, and a blue fluorescent layer 183 may be disposed on the white light emitting diode (W). Further, a sub-pixel may be formed using a color filter in which red, green, and blue are repeated, on the white light emitting diode (W).

Referring to FIG. 5C, a structure in which a red fluorescent layer 181, a green fluorescent layer 182, and a blue fluorescent layer 183 are disposed on an ultraviolet light emitting diode (UV) may be possible. As described above, a semiconductor light emitting diode can be used in the entire region including not only the visual light, but also ultraviolet light (UV), and can be expanded in the type of a semiconductor light emitting diode that can use ultraviolet light (UV) as an excitation source of an upper fluorescent body.

Referring to this embodiment again, the semiconductor light emitting diode 150 is positioned on the conductive adhesive layer 130, thereby constituting a sub-pixel in the display. Since the semiconductor light emitting diode 150 has excellent luminance, it can constitute an individual sub-pixel even in a small size. The individual semiconductor light emitting diode 150 may have a size with one side of 80 µm or less and may be a rectangular or a square diode. When it is a rectangle, the size may be 20×80 µm or less.

Further, even using a square semiconductor light emitting diode 150 having one side length of 10 µm as a sub-pixel, sufficient brightness for forming a display is shown. Accordingly, for example, in a case in which the size of a sub-pixel is a rectangular pixel having one side of 600 µm and the other one side of 300 µm, the distance of a semiconductor light emitting diode is relatively sufficiently large. Accordingly, in this case, it is possible to implement a flexible display having high quality over HD quality.

The display using the semiconductor light emitting diode described above can be manufactured by a new type of manufacturing method. Hereafter, this manufacturing method is described with reference to FIG. 6.

FIG. 6 shows cross-sectional views illustrating a method of manufacturing a display using a semiconductor light emitting diode of the present disclosure.

Referring to this figure, first, the conductive adhesive layer 130 is formed on the insulating layer 160 on which the auxiliary electrode 170 and the second electrode 140 are positioned. The insulating layer 160 is stacked on the first substrate 110, thereby forming one substrate (wiring board). Further, the first electrode 120, the auxiliary electrode 170, and the second electrode 140 are disposed on the wiring board. In this case, the first electrode 120 and the second electrode 140 may be disposed perpendicular to each other. Further, in order to implement a flexible display, the first substrate 110 and the insulating layer 160 each may include glass or polyimide (PI).

The conductive adhesive layer 130, for example, may be implemented by an anisotropic conductive film, and to this end, an anisotropic conductive film may be applied to a substrate on which the insulating layer 160 is positioned.

Next, a second substrate 112 on which a plurality of semiconductor light emitting diodes 150, which correspond to the positions of the auxiliary electrodes 170 and the second electrodes 140 and constitute individual pixels, is positioned is disposed such that the semiconductor light emitting diodes 150 face the auxiliary electrodes 170 and the second electrodes 140.

In this case, the second substrate 112, which is a growing substrate for growing the semiconductor light emitting diodes 150, may be a spire substrate or a silicon substrate.

The semiconductor light emitting diodes have a gap and a size that can form a display when they are formed in a wafer unit, so they can be effectively used for a display.

Next, the wiring board and the second substrate 112 are thermally pressed. For example, the wiring board and the second substrate 112 can be thermally pressed using an ACF press head. The wiring board and the second substrate 112 are bonded by the thermal pressing. Only the portions among the semiconductor light emitting diode 150, the auxiliary electrode 170, and the second electrode 140 have conductivity by the characteristics of an anisotropic conductive film having conductivity by thermal pressing, so the electrodes and the semiconductor light emitting diodes 150 can be electrically connected. In this case, the semiconductor light emitting diodes 150 are inserted in the anisotropic conductive film, so separation walls may be formed between the semiconductor light emitting diodes 150.

Next, the second substrate 112 is removed. For example, it is possible to remove the second substrate 112 using Laser Lift-off (LLO) or Chemical Lift-off (CLO).

Finally, the semiconductor light emitting diodes 150 are exposed to the outside by removing the second substrate 112. If necessary, it is possible to form a transparent insulating layer (not shown) by coating the top of the wiring board, to which the semiconductor light emitting diodes 150 are coupled, with silicon oxide (SiOx), etc.

Further, a step of forming a fluorescent layer on a surface of the semiconductor light emitting diode 150 may be further included. For example, the semiconductor light emitting diode 150 may be a blue semiconductor light emitting diode that emits blue light (B), and a red fluorescent body or a green fluorescent body for converting the blue light (B) into the light of a sub-pixel may form a layer on a surface of the blue semiconductor light emitting diode.

The manufacturing method or structure of the display using a semiconductor light emitting diode described above can be modified in various ways. As an example, a vertical semiconductor light emitting diode can also be applied to the display described above. Hereafter, a vertical structure is described with reference to FIGS. 5 and 6.

Further, in the modification or embodiment to be described hereafter, the same or similar components are given the same or similar reference numerals, and the above description is referred to for the description.

FIG. 7 is a perspective view showing another embodiment of a display using a semiconductor light emitting diode of the present disclosure, FIG. 8 is a cross-sectional view taken along line D-D of FIG. 7, and FIG. 9 is a conceptual view showing a vertical semiconductor light emitting diode of FIG. 8.

Referring to these figures, the display may be a display that uses passive matrix (PM) type of vertical semiconductor light emitting diodes.

The display includes a substrate 210, a first electrode 220, a conductive adhesive layer 230, a second electrode 240, and a plurality of semiconductor light emitting diodes 250.

The substrate 210, which is a wiring board on which the first electrode 220 is disposed, may include polyimide (PI) to implement a flexible display. Further, any materials may be used as long as they have insulation and flexibility.

The first electrode 220 is positioned on the substrate 210 and may be formed in a bar shape that is long in one direction. The first electrode 220 may be configured to function as a data electrode.

The conductive adhesive layer 230 is formed on the substrate 210 on which the first electrode 220 is positioned. Like a display to which flip-chip type light emitting diodes are applied, the conductive adhesive layer 230 may be an anisotropy conductive film (ACF), an anisotropy conductive paste, and a solution including conductive particles. However, in this embodiment, a case in which the conductive adhesive layer 230 is implemented by an anisotropic conductive film is exemplified.

An isotropic conductive film is positioned in a state in which the first electrode 220 is positioned on the substrate 210 and then the semiconductor light emitting diode 250 is connected by applying heat and pressure, the semiconductor light emitting diode 250 is electrically connected with the first electrode 220. In this case, it is preferable that the semiconductor light emitting diode 250 is disposed to be positioned on the first electrode 220.

The electrical connection, as described above, is generated because when heat and pressure are applied, the anisotropic conductive film partially has conductivity in the thickness direction. Accordingly, the anisotropic conductive film is divided into a portion having conductivity in the thickness direction and a portion not having conductivity in the thickness direction.

Further, since the anisotropic conductive film contains an adhesive component, the conductive adhesive layer 230 implements not only electrical connection, but also mechanical coupling between the semiconductor light emitting diode 250 and the first electrode 220.

As described above, the semiconductor light emitting diode 250 is positioned on the conductive adhesive layer 230, whereby it configures an individual pixel in the display. Since the semiconductor light emitting diode 250 has excellent luminance, it can constitute an individual sub-pixel even in a small size. The individual semiconductor light emitting diode 250 may have a size with one side of 80 μm or less and may be a rectangular or a square diode. When it is a rectangle, the size may be 20×80 μm or less.

The semiconductor light emitting diode 250 may be a vertical structure.

A plurality of second electrodes 240 disposed across the length direction of the first electrode 220 and electrically connected with the vertical semiconductor light emitting diodes 250 is positioned between the vertical semiconductor light emitting diodes.

Referring to FIG. 9, the vertical semiconductor light emitting diodes include a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 positioned at a lower portion can be electrically connected with the first electrode 220 by the conductive adhesive layer 230, and the n-type electrode 252 positioned at an upper portion can be electrically connected with the second electrode 240 to be described below. The semiconductor light emitting diode 250 has a large advantage in that electrodes can be disposed up and down, so the chip size can be reduced.

Referring to FIG. 8 again, a fluorescent layer 280 may be formed on a surface of the semiconductor light emitting diode 250. For example, the semiconductor light emitting diode 250 is a blue semiconductor light emitting diode 251 that emits blue light (B), and the fluorescent layer 280 for converting the blue light (B) into a color of a sub-pixel can be provided. In this case, the fluorescent layer 280 may be a red fluorescent 281 and a green fluorescent body 282 constituting an individual pixel.

That is, the red fluorescent body 281 that can convert blue light into red light (R) may be stacked on a blue semiconductor light emitting diode at a position where a red sub-pixel is formed, and the green fluorescent body 282 that can convert blue light into green light (G) may be stacked on a blue semiconductor light emitting diode at a position where a green sub-pixel is formed. Further, only a blue semiconductor light emitting diode may be independently used a portion forming a blue sub-pixel. In this case, red (R), green (G), and blue (B) sub-pixels can form one pixel.

However, the present disclosure is not necessarily limited thereto and other structures for implementing blue, green, and red, as described above, in a display to which flip-chip type light emitting diodes are applied may be applied.

According to this embodiment, the second electrodes 240 are disposed between the semiconductor light emitting diodes 250 and electrically connected with the semiconductor light emitting diodes. For example, the semiconductor light emitting diodes 250 may be disposed in a plurality of lines and the second electrodes 240 may be positioned between the lines of the semiconductor light emitting diodes 250.

Since the distance between the semiconductor light emitting diodes 250 that form individual pixels is sufficiently large, the second electrodes 240 can be positioned between the semiconductor light emitting diodes 250.

The second electrode 240 may be formed as an electrode in a bar shape that is long in one direction and may be disposed perpendicular to the first electrode.

Further, the second electrode 240 and the semiconductor light emitting diode 250 can be electrically connected by a connection electrode protruding from the second electrode 240. In more detail, the connection electrode may be the n-type electrode of the semiconductor light emitting diode 250. For example, the n-type electrode is formed as an ohmic electrode for ohmic contact and the second electrode covers at least a portion of the ohmic electrode by printing or depositing. Accordingly, the second electrode 240 and the n-type electrode of the semiconductor light emitting diode 250 can be electrically connected.

According to the figures, the second electrode 240 may be positioned on the conductive adhesive layer 230. Depending on cases, a transparent insulating layer (not shown) including silicon oxide (SiOx), etc., may be formed on the substrate 210 on which the semiconductor light emitting diodes 250 are formed. When the second electrode 240 is positioned after the transparent insulating layer is formed, the second electrode 240 is positioned on the transparent insulating layer. Further, the second electrodes 240 may be formed to be spaced apart from each other on the conductive adhesive layer 230 or the transparent insulating layer.

If a transparent electrode such as ITO (Indium Tin Oxide) is used to position the second electrode 240 on the semiconductor light emitting diode 250, there is a problem in that the ITO substance is not bonded well to a semiconductor layer. Accordingly, the present disclosure has the advantage that there is no need for using a transparent electrode such as ITO by positioning the second electrode 240 between the semiconductor light emitting diodes 250. Accordingly, it is possible to improve optical extraction efficiency by using a conductive substance, which is bonded well to an n-type semiconductor layer, as a horizontal electrode without being limited to selection of a transparent material.

According to the figures, a separation wall 290 may be positioned between the semiconductor light emitting diodes 250. That is, the separation wall 290 may be disposed between the vertical semiconductor light emitting diodes 250 to isolate the semiconductor light emitting diodes 250 forming individual pixels. In this case, the separation wall 290 can serve to separate individual sub-pixels and may be formed integrally with the conductive adhesive layer 230. For example, the semiconductor light emitting diodes 250 are inserted in the anisotropic conductive film, the base member of the anisotropic conductive film can form the separation wall.

Further, when the base member of the anisotropic conductive film is black, the separation wall 290 can have a reflective characteristic and the contrast can be increased even without a discrete black insulator.

As another example, a reflective separation wall may be provided as the separation wall 190. The separation wall 290 may include a black or white insulator, depending on the object of the display.

If the second electrode 240 is positioned directly on the conductive adhesive layer 230 between the semiconductor light emitting diodes 250, the separation wall 290 may be positioned between each of the semiconductor light emitting diodes 250 and the second electrodes 240. Accordingly, there is an effect that it is possible to configure individual sub-pixels even in a small size using the semiconductor light emitting diodes 250, it is possible to position the second electrode 240 between the semiconductor light emitting diodes 250 because the distance of the semiconductor light emitting diodes 250 is relatively larger, and it is possible to implement a flexible display having HD quality.

Further, according to the figures, a black matrix 291 may be disposed between fluorescent bodies to improve contrast. That is, the black matrix 291 can improve the contrast of light and darkness.

As described above, the semiconductor light emitting diode 250 is positioned on the conductive adhesive layer 230, whereby it configures an individual pixel in the display. Since the semiconductor light emitting diode 250 has excellent luminance, it can constitute an individual sub-pixel even in a small size. Accordingly, a full-color display in which red (R), green (G), and blue (B) sub-pixels form one pixel by semiconductor light emitting diodes can be implemented.

FIG. 10 is a cross-sectional view illustrating a frame, an inner fixing member, and an outer adjusting member according to an embodiment of the present disclosure.

The display 100 may include a display panel 2, and a nut 10 fixed to a rear surface of the display panel 2.

The display panel 2 may be an assembly of a plurality of members. For example, the display panel 2 may be a micro-LED display (LDM).

The display panel 2 may include thin film transistor (TFT) glass and a driving substrate disposed on a rear surface of the TFT glass. The display panel 2 may further include the inner module disposed on the rear surface of the driving substrate to protect the driving substrate. The display panel 2 may further include a module cover 6 disposed on the rear surface of the inner module.

When the display panel 2 includes the TFT glass and the driving substrate, and does not include the inner module and the module cover 6, the driving substrate may form the rear surface of the display panel 2, and the nut 10 may be fixed to the rear surface of the driving substrate by using an adhesive, such as a bonding agent, or an adhesive member such as double-sided tape.

When the display panel 2 includes the TFT glass, the driving substrate, and the inner module, and does not include the module cover 6, the inner modules may form the rear surface of the display panel 2, and the nut 10 may be fixed to the rear surface of the inner module by using an adhesive, such as a bonding agent, or an adhesive member such as double-sided tape.

When the display panel 2 includes the TFT glass, the driving substrate, the inner module, and the module cover 6, the module cover 6 may form the rear surface of the display panel 2.

The nut 10 may be fixed to the rear surface of the module cover 6 by using an adhesive, such as a bonding agent, or an adhesive member such as double-sided tape.

The display panel 2 may have a front surface 7 and a rear surface 8, and may have a circumferential surface 9 connecting the front surface 7 to the rear surface 8.

The nut 10 may be disposed to protrude from the rear surface of the display panel 2, may be integrated with the display panel 2, and may constitute a display assembly together with the display panel.

The display panel 2 may be coupled to the frame 20 to be spaced apart from the frame 20, the rear surface 8 of the display panel 2 may be spaced apart from a front surface 27 of the frame 20, and a gap G may be formed between the rear surface 8 of the display panel 2 and the front surface 27 of the frame 20.

The display may include a plurality of display assemblies, and the display may further include a frame 20 on which the plurality of display assemblies are mounted.

The plurality of display assemblies may be coupled to the frame 20 to be positioned in front of the frame 20. It is preferred that the plurality of display assemblies may not have step difference frontward or rearward, and the display assemblies may be coupled to the frame 20, such that front surfaces of display panels 2 are positioned on the same plane (e.g., vertical plane).

The frame 20 may be a single fixer frame to assemble the plurality of display assemblies.

In the display 20, four, nine, and 16 display panels 2 may be assembled in one frame 20.

The plurality of display assemblies may be coupled to the frame 20 using a plurality of fastening members 30 and 40. The plurality of fastening members 30 and 40 may have a shape and a structure making it easy to align the front surfaces the plurality of display panels 2 in line with each other.

The frame 20 may be formed therein with a fastening hole 22 facing the nut 10, and a female thread 24 may be formed in the fastening hole 22.

The plurality of fastening members 30 and 40 may include at least two fastening members, and any one of the fastening members 30 and 40 may be disposed to pass through a remaining one of the fastening members 30 and 40.

The plurality of fastening members 30 and 40 may include an outer fastening member and an inner fastening member.

The outer fastening member may be an outer adjusting member 30 to adjust the display panels 2 of the plurality of display assemblies to have equal spacing from the frame 20.

The inner fastening member may be the inner fixing member 40 fixedly coupled to the nut 10.

The outer adjusting member 30 may include a hollow portion 31 and an outer head portion 35.

The hollow portion 31 may be formed thereon with a male thread screwed to the female thread 24. The male thread 34 may be formed on an outer circumferential surface of the hollow portion 31.

The outer head portion 35 may protrude from the hollow portion 31. The outer head portion 35 may be formed to protrude from a rear end of the hollow portion 31. The outer head portion 35 may protrude radially from the rear end of the hollow portion 31. The size of the outer head portion 35 may be larger than the size of the hollow portion 31.

The inner fixing member 40 may include a thread portion 41 and an inner head portion 45.

The thread portion 41 may pass through the hollow portion 31. The thread portion 41 may be screwed to the nut 20.

The inner head portion 45 may be seated in the outer head portion 35 or the hollow portion 31.

The inner head portion 45 may be seated on an inner surface of the outer head portion 35 or on the rear end of the hollow portion 31.

A plurality of display panels 2, a plurality of nuts 10, a plurality of outer adjusting members 30, and a plurality of inner fixing members 40 may be provided.

The display panel 2, the nut 10, the outer adjusting member 30, and the inner fixing member 40 may constitute one set, and the display may include a plurality of sets.

Hereinafter, the hollow portion 31, the outer head portion 35, the thread portion 41, and the inner head portion 45 will be described in detail.

The outer head portion 35 may be formed therein with a space 36 to receive the inner head portion 45.

The outer circumference of the outer head portion 35 may have a polygonal shape. When the hollow portion 31 is screwed to the frame 20, the outer head portion 35 may be positioned at a rear portion of the frame 20. A front end of the outer head portion 35 may be spaced apart from a rear surface 28 of the frame 20.

A rear end of the nut 10 may be a contact end to make contact with a front end of the outer adjusting member 30. A front end of the hollow portion 31 may make contact with the rear end of the nut 10.

The nut 10 may include a plurality of bodies 11 and 15 having different sizes. A portion of the nut 10 may be inserted into the fastening hole 22, and a remaining portion of the nut 10 may be positioned in front of the fastening hole 22

The plurality of bodies 11 and 15 may include a first body 11 larger than the fastening hole 22, and a second body 15 protruding from the first body 11 and smaller than the fastening hole 22.

The first body 11 of the nut 10 may be entirely positioned in front of the fastening hole 22. The second body 15 of the nut 10 may be entirely or partially positioned inside the fastening hole 22.

When the entire portion of the second body 15 is inserted into the fastening hole 22, the spacing between the display panel 2 and the frame 20 may be minimized.

When the entire portion of the second body 15 is positioned in front of the fastening hole 22, the spacing between the display panel 2 and the frame 20 may be increased.

An inner diameter D1 of the hollow portion 31 may be larger than an inner diameter D2 of the second body 15 and an outer diameter of the thread portion 41.

An outer diameter D4 of the second body 15 is smaller than an outer diameter D5 of the hollow portion 31 and larger than the inner diameter D1 of the hollow portion 31.

Meanwhile, when fastened with the display panel 2, the frame 20 may be formed therein with an opening 26 facing the edge 9 of the display 20. The opening 26 may be spaced apart from the fastening hole 22. The opening 26 may be open toward edges 9 of a pair of display panels 2 adjacent to each other.

The opening 26 may be a hole to sense the step difference between the display panels 2 frontward or rearward.

The display 100 may further include a back cover 50 to form an outer appearance of the rear surface. The display 100 may further include an outer appearance member 60 to hide the space between the back cover 30 and the display panel.

FIGS. 11 to 14 are views illustrating assembling processes for a plurality of display panels.

FIG. 11 is a cross-sectional view illustrating a frame positioned on a plurality of display panels according to an embodiment of the present disclosure. FIG. 12 is a cross-sectional view an inner fixing member screwed with the nut illustrated in FIG. 11. FIG. 13 is a cross-sectional view illustrating a step difference between a plurality of display panels illustrated in FIG. 12, when the step difference is measured. FIG. 14 is a cross-sectional view illustrating a plurality of display panels illustrated in FIG. 13 aligned in line.

FIG. 15 is a flowchart illustrating a method for manufacturing a display according to the present embodiment.

As illustrated in FIG. 11, the method for manufacturing the display includes seating the plurality of display panels 2 having the nuts 10 fixed thereto on a stage (not illustrated), such that the nut 10 faces up (S1), screwing the hollow portion 31 of the outer adjusting member 30 with the frame 20 including the fastening hole 22 having the female thread 24 (S2), and positioning the frame 20 screwed with the outer adjusting member 30 above the plurality of display panels 2 to be spaced apart from the plurality of display panels 2 (S3).

The nut 20 may be attached to the display panel 2 by an adhesive member, such as double-sided tape or a bonding agent, and the display panel 2 may be laid down such that the front surface 7 thereof faces down and the bottom surface 8 thereof faces up (S1).

The male thread 34 formed in the hollow portion 31 of the outer adjusting member 30 may be screwed to the female thread 24 formed in the fastening hole 22 of the frame 20, and the outer adjusting member 30 may be temporarily assembled to the frame 20. In addition, the frame 20 may be horizontally laid down, such that the outer head 35 of the outer adjusting member 30 is positioned above the frame 20 (S2).

In the state that the nut 10 is assembled to the display panel 2, and the outer adjusting member 30 is temporarily assembled to the frame 20 as described above, the frame 20 having the outer adjusting member 30 temporarily assembled thereto may be positioned above the display panel 2.

The plurality of display panels 2 are individually assembled by the plurality of inner fixing members 40.

The method for manufacturing the display may further include inserting the thread portion 41 of the inner fixing member 40 into the hollow portion 31 and screwing the thread portion 41 with the nut 10.

When the thread portion 41 of the inner fixing member 40 is inserted into the hollow portion 31, the inner head portion 45 of the inner fixing member 40 is inserted into and received in the outer head portion 35 protruding out of the hollow portion 31.

In the step of screwing the thread portion 41 of the inner fixing member 40 with the nut 10, the nut 10 may make contact with the hollow portion 31.

The inner head portion 45 of the inner fixing member 40 may make contact with the end portion of the hollow portion 31, and the hollow portion 31 of the outer adjusting member 30 may be interposed between the inner head portion 45 and the nut 10.

The spacing between the display panel 2 and the frame 20 may be determined depending on the screw-coupling position of the outer adjusting member 30, and the plurality of display panels 2 may have the step difference "G".

The method for manufacturing the display may further include sensing the step difference between the plurality of display panel 2 (S5), as illustrated in FIG. 13.

In sensing the step difference between the plurality of display panel 2 (S5), a distance sensor 70 disposed above the opening 26 formed in the frame 20 may sense the distance between the edges 9 of the pair of display panels 2 adjacent to each other through the opening 26.

The distance sensor 70 may be a non-contact type distance sensor and may sense a position of the display panel 2. The distance sensor 70 may include, for example, a distance sensor, such as an infrared distance sensor or an ultrasonic distance sensor.

The distance sensor 70 may include a first distance sensor 72 to sense one of display panels 2 adjacent to each other and a second distance sensor 74 to sense another of the display panels 2.

The first distance sensor 72 and the second distance sensor 74 may sense the display panels 2, at the same height.

The method for manufacturing the display includes aligning the display panels 2 in line with each other by rotating the outer adjusting member 30 (S6), when the step difference "G" between the plurality of display panels 2 is out of a set range as illustrated in FIG. 14.

Relatively, when the outer adjusting member 30 of the display 2 positioned at the lower side is rotated to be moved up, the inner fixing member 40 may be moved up along the outer adjusting member 30, and the nut 10 toothed to the inner fixing member 40 may be moved up together with the display panel 2.

In the step of aligning the plurality of display panels 2 in line with each other, the display panel 2 may be assembled to be spaced apart from the frame 20 (S6).

As described above, the step difference "G" of the display panel 2 may be minimized as illustrated in FIG. 14, and the front surface 7 of the display panel 2 may be positioned on the same plane.

The above description is merely an example of the technical idea of the present disclosure, and various modifications and modifications may be made by one skilled in the art without departing from the essential characteristic of the invention.

Therefore, the exemplary embodiments of the present disclosure are provided to explain the spirit and scope of the present disclosure, but not to limit them, so that the spirit and scope of the present disclosure is not limited by the embodiments.

The scope of the present disclosure should be construed on the basis of the accompanying claims, and all the technical ideas within the scope equivalent to the claims should be included in the scope of the present disclosure.

The invention claimed is:

1. A display comprising:
   a display panel;
   a nut fixed to a rear surface of the display panel;
   a frame including a female thread formed in a fastening hole facing the nut;
   an outer adjusting member including a hollow portion formed therein having a male thread that is screwed with the female thread of the fastening hole, and an outer head portion protruding out of the hollow portion; and
   an inner fixing member including a thread portion passing through the hollow portion and screwed with the nut, and an inner head portion seated on the outer head portion or the hollow portion.

2. The display of claim 1, wherein the rear surface of the display panel is spaced apart from a front surface of the frame.

3. The display of claim 1, wherein the outer head portion includes a space to receive the inner head portion.

4. The display of claim 1, wherein an outer circumference of the outer head portion has a polygonal shape.

5. The display of claim 1, wherein a rear end of the nut is a contact end configured to contact a front end of the outer adjusting member.

6. The display of claim 1, wherein the nut includes a first body larger than the fastening hole, and a second body protruding from the first body and smaller than the fastening hole.

7. The display of claim 6, wherein an inner diameter of the hollow portion is larger than an inner diameter of the second body and an outer diameter of the thread portion.

8. The display of claim 6, wherein an outer diameter of the second body is smaller than an outer diameter of the hollow portion and greater than an inner diameter of the hollow portion.

9. The display of claim 1, wherein the frame includes an opening spaced apart from the fastening hole and facing an edge of the display panel.

10. The display of claim 9, wherein the display panel is provided in plural, and
    wherein the opening is open toward edges of a pair of the plurality of display panels adjacent to each other.

11. A method for manufacturing a display, the method comprising:
    seating a plurality of display panels having nuts fixed thereto on a stage, such that the nuts face up;
    screwing a hollow portion of an outer adjusting member having a male thread with a frame including a fastening hole having a female thread;
    positioning the frame screwed with the outer adjusting member above the plurality of display panels and spaced apart from the plurality of display panels;
    inserting a thread portion of an inner fixing member into the hollow portion and screwing the thread portion with the nut;
    sensing a step difference between the plurality of display panels; and
    aligning the plurality of display panels to be in line with each other by rotating the outer adjusting member, when the step difference between the plurality of display panels is out of a set range.

12. The method of claim 11, wherein the aligning of the plurality of display panels in line with each other includes:
    assembling each display panel to be spaced apart from the frame.

13. The method of claim 11, wherein an inner head portion of the inner fixing member is inserted into and received in an outer head portion protruding from the hollow portion.

14. The method of claim 11, wherein the inserting of the thread portion of the inner fixing member with the nut includes:
    bringing the nut in contact with the hollow portion.

15. The method of claim 11, wherein the sensing of the step difference between the plurality of display panels includes:
    sensing, by a distance sensor disposed above the opening formed in the frame, a distance between edges of a pair of the plurality of display panels that are adjacent to each other through the opening.

16. The display of claim 1, wherein the display panel, the nut, the outer adjusting member, and the inner fixing member are respectively provided in plural.

17. A display comprising:
    a display panel;
    a nut attached to the display panel;
    a frame including a fastening hole that penetrates the frame, the fastening hole having a first end receiving the nut and a second end opposite to the first end;
    an outer adjusting member received at the second end of the fastening hole and secured to the fastening hole; and
    an inner fixing member penetrating the outer adjusting member from the second end to the first end and secured to the nut,
    wherein the outer adjusting member is secured to the fastening hole by a female thread formed on an inner surface of the fastening hole and a male thread formed on an outer surface of the outer adjusting member.

18. The display of claim 17, wherein the inner fixing member is secured to the nut by a thread formed on an inner surface of the nut and a thread formed on an outer surface of the inner fixing member.

19. The display of claim 17, wherein the display panel, the nut, and the outer adjusting member are provided in plural, and wherein the plurality of display panels are aligned based on relative adjustments of the plurality of outer adjusting member to the plurality of nuts, respectively.

* * * * *